(12) United States Patent
Summerfelt

(10) Patent No.: US 6,730,616 B2
(45) Date of Patent: May 4, 2004

(54) VERSATILE PLASMA PROCESSING SYSTEM FOR PRODUCING OXIDATION RESISTANT BARRIERS

(75) Inventor: Scott R. Summerfelt, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/253,338

(22) Filed: Sep. 24, 2002

(65) Prior Publication Data

US 2003/0060059 A1 Mar. 27, 2003

Related U.S. Application Data

(60) Provisional application No. 60/324,651, filed on Sep. 24, 2001.

(51) Int. Cl.$^7$ .............................................. H01L 21/31
(52) U.S. Cl. .................. 438/775; 438/542; 438/683; 438/778; 438/798; 427/452

(58) Field of Search ................................. 438/775, 778, 438/798, 542, 683; 427/452

(56) References Cited

U.S. PATENT DOCUMENTS

| | | | |
|---|---|---|---|
| 6,277,448 B2 | * | 8/2001 | Strutt et al. .................. 427/452 |
| 6,346,465 B1 | * | 2/2002 | Miura et al. .................. 438/542 |
| 6,495,461 B2 | * | 12/2002 | Tsubouchi et al. ........... 438/683 |

* cited by examiner

Primary Examiner—David Nelms
Assistant Examiner—Reneé R. Berry
(74) Attorney, Agent, or Firm—Carlton H. Hoel; W. James Brady; Frederick J. Telecky, Jr.

(57) ABSTRACT

A versatile system for forming diffusion barriers in semiconductor processing that simplifies device processing, utilizing existing production compounds and materials while resulting in uniform and proper device structuring, is disclosed, providing a system using a reactive plasma to selectively form diffusion barriers and provide selective oxidation.

6 Claims, 6 Drawing Sheets

VERSATILE PLASMA PROCESSING SYSTEM FOR PRODUCING OXIDATION RESISTANT BARRIERS

This application claims the benefit of Provisional application No. 60/324,651 filed Sep. 24, 2001.

FIELD OF THE INVENTION

This invention relates, in general, to improving electrical connections in semiconductor device processing and, in particular, to improving electrical connections to materials with high dielectric constants, such as in the construction of capacitors.

BACKGROUND OF THE INVENTION

The increasing density of high performance integrated circuits (e.g., Gbit range DRAMs) is increasing the need for the use of materials with high dielectric constants in electrical devices and structures, such as capacitors. Generally, capacitance is directly related to the surface area of an electrode in contact with the capacitor dielectric, but is not significantly affected by the electrode volume. Current methods generally utilized to achieve higher capacitance per unit area increase the surface area/unit area by increasing the topography, such as in trench and stack capacitors using $SiO_2$ or $SiO_2/Si_3N_4$ as the dielectric. This approach becomes very difficult in terms of manufacturability for devices such as high capacity DRAM.

An alternative approach is to use a high permittivity dielectric material. Many perovskite, ferroelectric, or high dielectric constant (hereafter abbreviated HDC) materials, such as $(Ba,Sr)TiO_3$ (BST), usually have much larger capacitance densities than standard $SiO_2$—$Si_3N_4$—$SiO_2$ capacitors. Various metals and metallic compounds, and typically noble metals such as Pt and conductive oxides such as $RuO_2$, have been proposed as the electrodes for these HDC materials. To be useful in electronic devices, however, reliable electrical connections should generally be constructed which do not diminish the beneficial properties of these high dielectric constant materials.

As used herein, the term "high dielectric constant" means a dielectric constant of about 50 or greater at device operating temperature. HDC materials are useful for the fabrication of many electrical devices, such as capacitors. However, HDC materials are generally not chemically stable when deposited directly on a semiconductor substrate, so one or more additional layers are required to provide the electrical connection between the HDC material and the substrate. The additional layer or layers should generally be chemically stable when in contact with the substrate and also when in contact with the HDC material. Additionally, due to unit area constraints, high-density devices (e.g., Gbit range DRAMs) generally require a structure in which the lower electrode is conductive from an HDC material down to a substrate.

The deposition of an HDC material usually occurs at a high temperature (generally greater than about 500° C.) in an oxygen-containing atmosphere. An initial electrode structure formed prior to this deposition should be stable both during and after this deposition, while subsequent electrode structures formed after this deposition need only be stable after this deposition.

As already noted, ferroelectrics such as BST are promising high-density dielectrics, and they have achieved much larger capacitance densities than $SiO_2$—$Si_3N_4$—$SiO_2$ (ONO) capacitors. These dielectrics require metallic top and bottom electrodes. The bottom electrode in particular must be stable during the deposition of oxide, which occurs at high temperature (greater than 500° C.) in an oxygen-containing atmosphere. Therefore, two types of materials have been evaluated as the lower electrode, a noble metal, such as Pt, or a conductive oxide, such as $RuO_2$. There are, however, a number of problems with electrodes formed of these materials. Many of these problems are related to choice of materials, processing, and integration.

Some of these issues are better understood in light the following examples of conventional device structure illustrated in FIGS. 1, 2A and 2B. FIG. 1 depicts a device geometry 100 that is relatively simple in terms of demands on the electrode. In this geometry, contact is made through bottom electrode 102, and buffer layer 104 is needed only as a sticking layer. In contrast, geometries 200 and 202, of FIGS. 2A and 2B, respectively, require electrical contact through both bottom electrode 204 and buffer layer 206 to the substrate 208. In FIG. 2A, contact is made directly to substrate 208. In contrast, FIG. 2B utilizes a plug 210. The electrode structure of geometries 200 and 202 retains its conductivity even after the deposition of a dielectric, if an appropriate barrier layer(s) is used between the conductive oxide and the silicon substrate.

As previously noted, the lower electrode in contact with the high dielectric constant materials is typically either a noble metal, such as Pt, or a conductive oxide, such as $RuO_2$. Pt has several problems, when used as a lower electrode, which prevent it from being used alone. Pt usually allows oxygen to defuse through it and, hence, allows neighboring materials to oxidize. Pt does not stick very well to traditional dielectrics, such as $SiO_2$ or $Si_3N_4$. Pt rapidly forms a silicide at low temperatures, and readily forms hillocks under stress.

Currently, electrodes most commonly used for BST are Pt (as electrode 204) and Ta (as buffer 206), and TiN for a top electrode 212. During BST deposition, Ta oxidizes and becomes an insulating material. Such a process produces an electrode that is suitable for geometry 100 of FIG. 1, but not for geometries 200 or 202. Other electrode structures have been proposed, including alloys of Pt, Pd, and Rh (as electrode 204), and oxides made of Re, Os, Rh, and Ir (as buffer 206), on Si or polysilicon. Another structure that has been proposed uses Pt as bottom electrode 204, with TiN/Ti as buffer layer 206. This structure is believed to be stable below 600° C. Degradation is dependant on the thickness, deposition technique of the TiN, $TiSi_2$ and Pt layers.

Thus, most conventional attempts to create a more stable bottom electrode for high dielectric constant materials focus on changing a diffusion barrier material into something more stable to oxygen. This often results is extremely complex and expensive device processing methods, capable of introducing a number of flaws into the resulting products. Furthermore, most conventional processes and methodologies do not provide for selective deposition of diffusion barrier material, and thus selective oxidation.

SUMMARY OF THE INVENTION

Therefore, a versatile system for forming diffusion barriers in semiconductor processing that simplifies device processing, allows for selective deposition and selective oxidation, utilizing existing production compounds and materials, while resulting in uniform and proper device structuring, is now needed; providing cost-effective and efficient processing and device performance while overcoming the aforementioned limitations of conventional methods.

The present invention provides a system, simplifying device processing by using a reactive plasma to form diffusion barriers. The present invention may be applied utilizing any number of conventional device fabrication materials, thus providing an economical solution to complex device manufacturing. The present invention provides the ability to selectively form diffusion barriers, only where desired, and thus provides for selective oxidation.

More specifically, the present invention provides a method of preparing a semiconductor device for selective oxidation. A first device structure is formed. A selected portion of the first device structure is then chemically altered, using any one of a number of fabrication processes. An oxide is then disposed upon the chemically altered portion of the first device structure.

The present invention also provides a method of forming a diffusion barrier within a semiconductor device. A first device structure provided. A selected portion of the first device structure is then nitrided. A second device structure is then disposed upon the nitrided portion of the first device structure.

BRIEF DESCRIPTION OF THE DRAWINGS

For a more complete understanding of the features and advantages of the present invention, reference is now made to the detailed description of the invention along with the accompanying figures in which corresponding numerals in the different figures refer to corresponding parts and in which.

DETAILED DESCRIPTION

While the making and the use of the present invention is discussed in detail below, it should be appreciated that the present invention provides many applicable inventive concepts which can be embodied in a wide variety of specific contexts. The specific embodiments discussed herein are merely illustrative of specific ways to make and use the invention, do not delimit the scope of the invention.

As previously described, most conventional attempts to create a more stable bottom electrode for HDC materials have focused on changing the diffusion barrier material into something more stable to oxygen. The present invention, however, provides a system that simplifies device processing by using reactive plasma to help form diffusion barriers.

The present invention provides a system for producing oxidation resistant barriers (e.g., diffusion barriers) in a selective fashion. A first device structure (e.g., a metal contact), or some portion thereof, is selected for alteration. That portion is then subjected to an alteration process (e.g., reactive plasma nitridization), forming the barrier. An oxide is then disposed upon the altered portion of the structure.

As an example, the present invention may be used in the formation of WN. $WN_x$ may be used as a diffusion barrier between Al and W. In one embodiment, W is first deposited, and then subjected to an $N_2$ plasma treatment (e.g., 300 W RF power, 230 $V_{DC}$, 80M Torr, 50° C. substrate temperature, and 60 seconds exposure). The resulting WN is about 6 nanometers thick and has a composition of $WN_{1.6}$. AL/W resistance increases 140% to 180% after 30 minutes anneal at 450° C. without nitriding the W. Only a 10% increase in resistance occurs if nitridization is used. The WN prevents reaction between W and Al while, without the barrier, the materials react.

Figure 1:
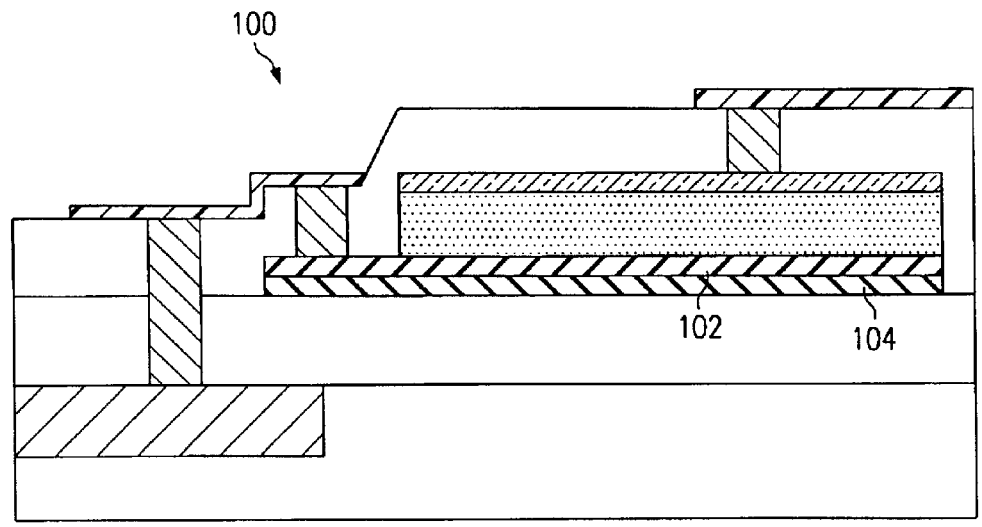
FIG. 1 is a prior art device structure.
Figure 2A:
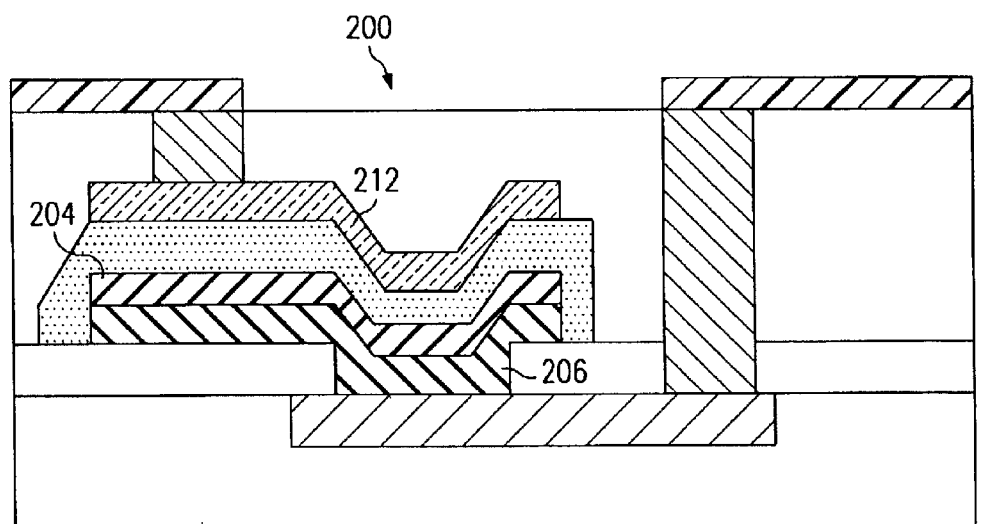
FIGS. 2A and 2B are prior art device structures.
Figure 2B:
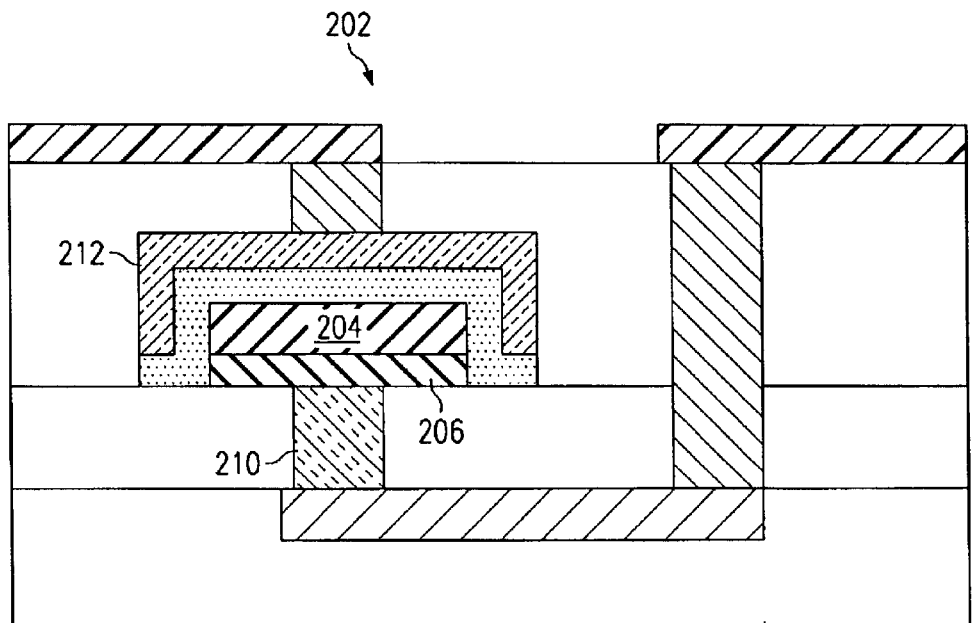
Figure 3:
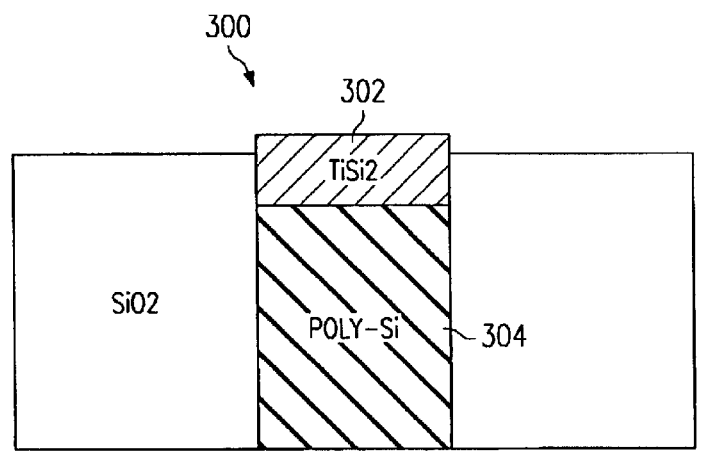
FIG. 3 is an illustrative diagram of a structure according to the present invention.
Figure 4A:
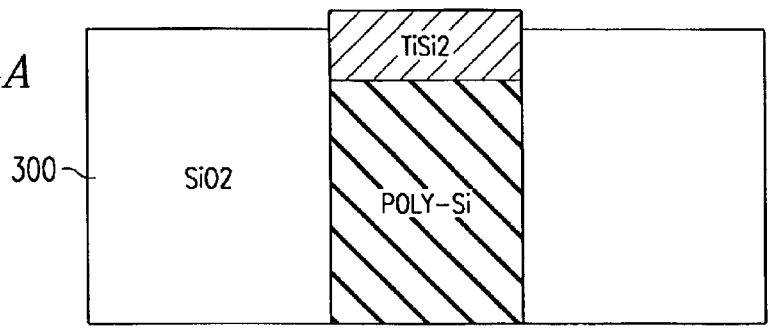
FIGS. 4A–4C are illustrative diagrams of a process without benefit of the present invention.
Figure 4B:
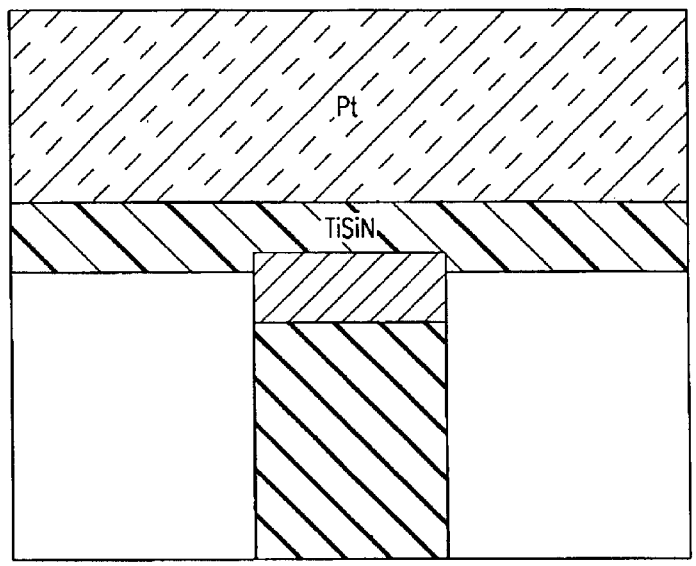
Figure 4C:
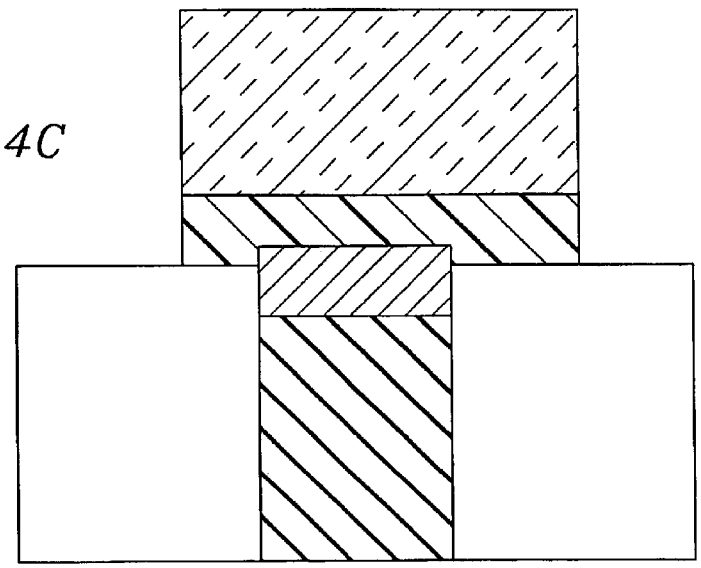
Figure 5A:
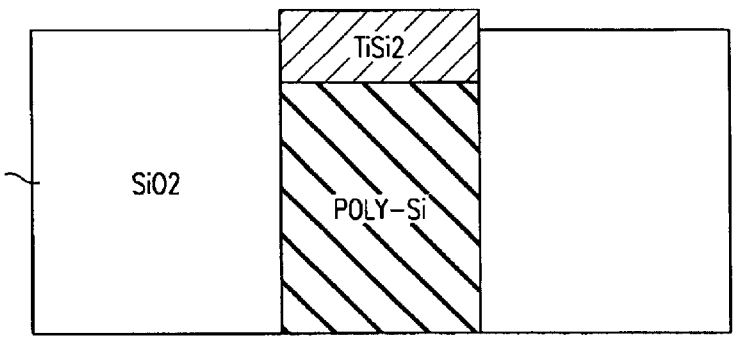
FIGS. 5A–5D are illustrative diagrams of a process according to the present invention.
Figure 5B:
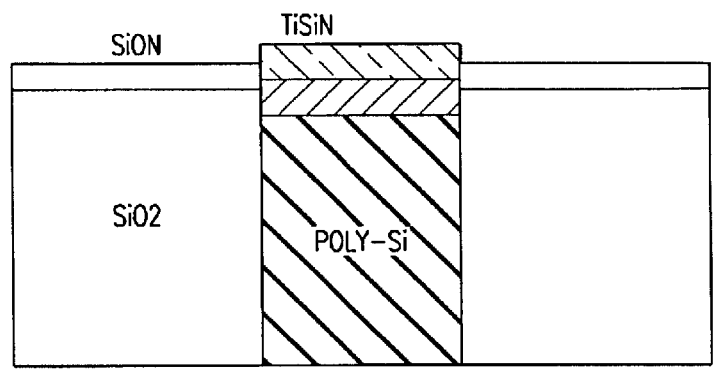
Figure 5C:
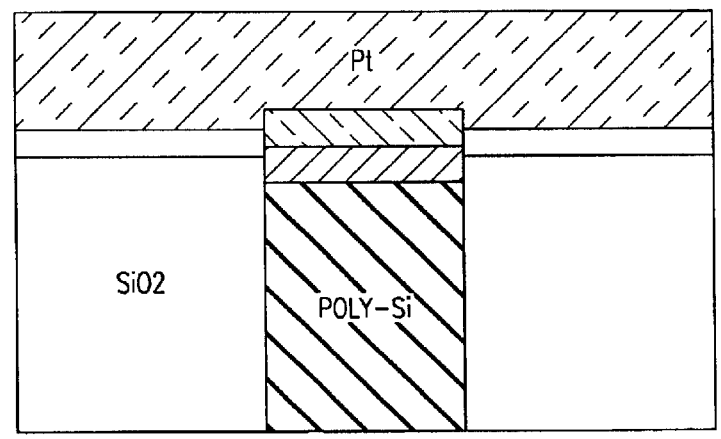
Figure 5D:
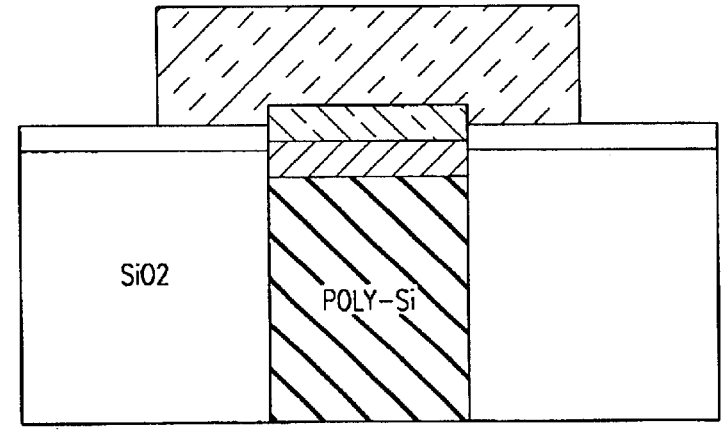

The present invention is now described and illustrated in greater detail with reference to FIGS. 3–5. According to the present invention, a silicide (e.g., titanium silicide) is nitrided, forming a resulting silicon nitride (e.g., titanium silicon nitride). The present invention thus provides a diffusion barrier that is oxidation resistant. Referring now to FIG. 3, a plug structure 300 after formation of titanium silicide in accordance with the present invention is illustrated. Notice that the titanium silicide 302 is only on the polysilicon plug 304.

This configuration may be produced using a variation of a salicide process. Other processes such as selective silicidization or selective CVD can also be used. Without the plasma process of the present invention, a diffusion barrier must be formed by deposition, and removed by patterning as shown in steps A–C of FIG. 4.

The nitridization process of the present invention, as illustrated in steps A–D of FIG. 5, replaces these two processes with just one. The nitridization process of the present invention forms a self-aligned diffusion barrier.

According to the nitridization process of the present invention, the diffusion barrier is not exposed during deposition of BST. The interface between Pt and the diffusion barrier is not directly exposed, maintaining a low contact resistance due to interfacial oxidation. Capacitor height is minimized.

It is possible that the thickness of TiSiN may be limited by the nitridization process. The exact thickness is therefore dependent on which specific nitridization process is utilized. This does not apply to deposited films. Also, the surface of the silicon dioxide will convert to SiON—which, in general, is a better diffusion barrier than silicon dioxide.

This is not significant for BST, which does not need a diffusion barrier, but in the case of more reactive high-K materials, such as $SrBi_2Ta_2O_9$ or $Pb(Zr,Ti)O_3$, the creation of a diffusion barrier without separate deposition process is an advantage.

The present invention can easily be applied to form a wide variety of diffusion barriers based on nitrides, carbides, borides, and even oxides from their respective silicides. Forming nitrides requires using $N_2$ or $NH_3$ gas, while carbides can be formed using $CH_3$ or other organic compounds, oxides with $O_2$, oxy-nitrides with $NO_2$ or NO, and borides with diborane ($B_2H_6$).

Many of the diffusion barriers previously discussed are based on silicides, such as TiSiN. It is relatively simple to convert the silicides to a respective diffusion barrier compounds. One advantage of using plasma processing to form these diffusion barriers is the fact that the plasma process will tend to form amorphous compounds. Amorphous compounds are generally better diffusion barriers than their crystalline counterparts.

Figure 6A:
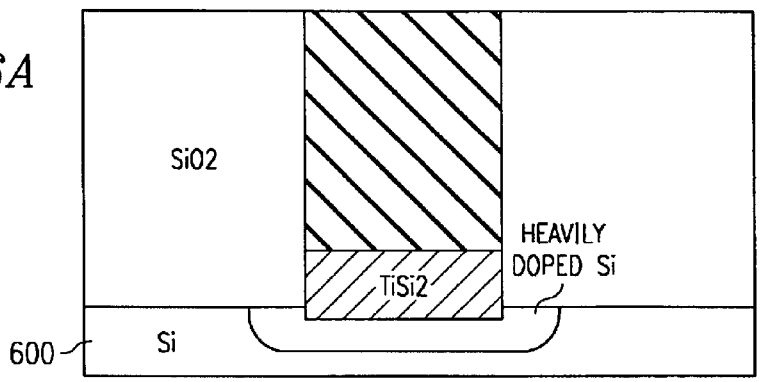
FIGS. 6A–6C are illustrative diagrams of a process according to the present invention.
Figure 6B:
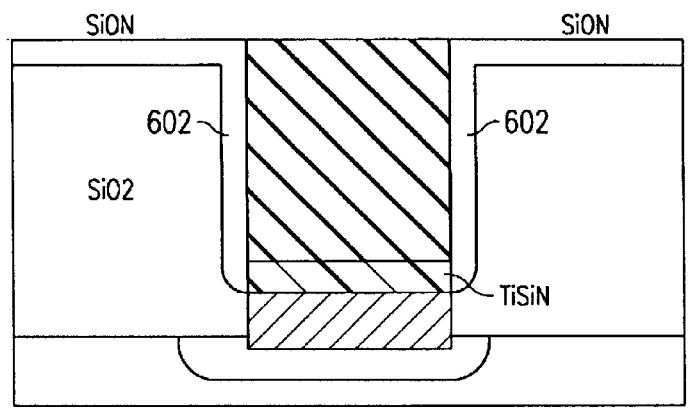
Figure 6C:
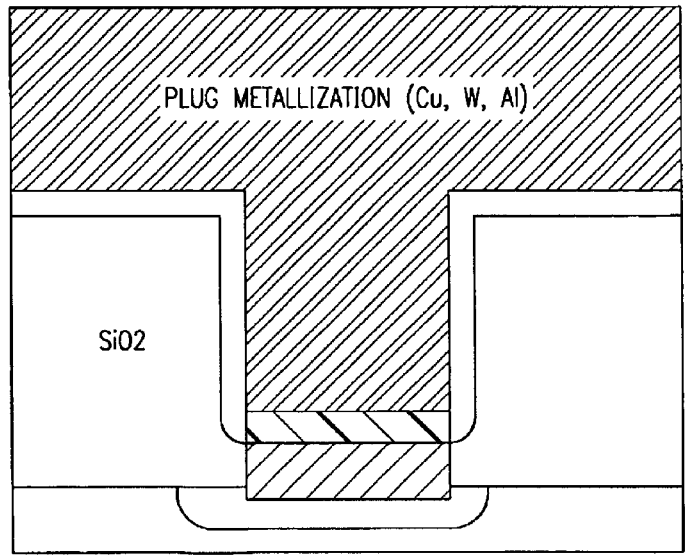

Referring now to FIG. 6, steps A–C illustrate formation of a via to silicon structure 600, using plasma nitridization of a silicide to form a nitride diffusion barrier 602 on both side walls and the silicide.

Figure 7A:
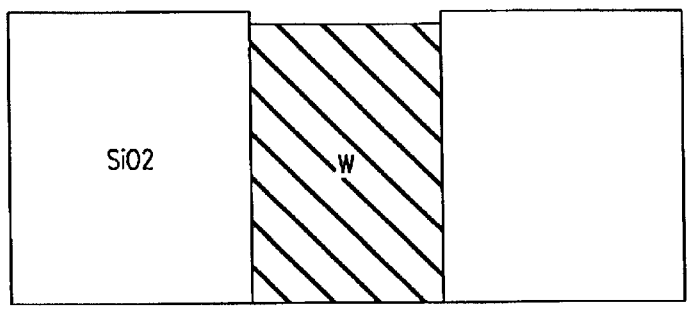
FIGS. 7A–7C are illustrative diagrams of a process according to the present invention.
Figure 7B:
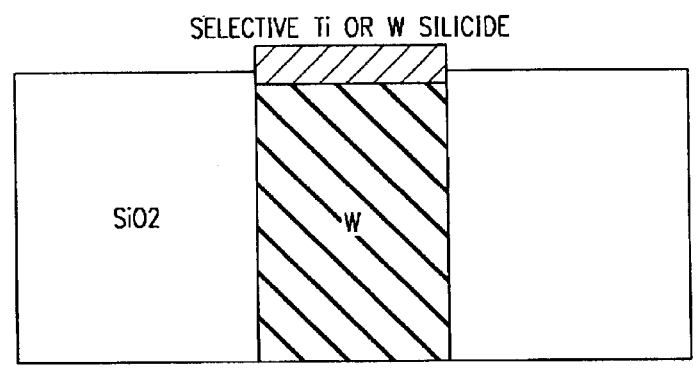
Figure 7C:
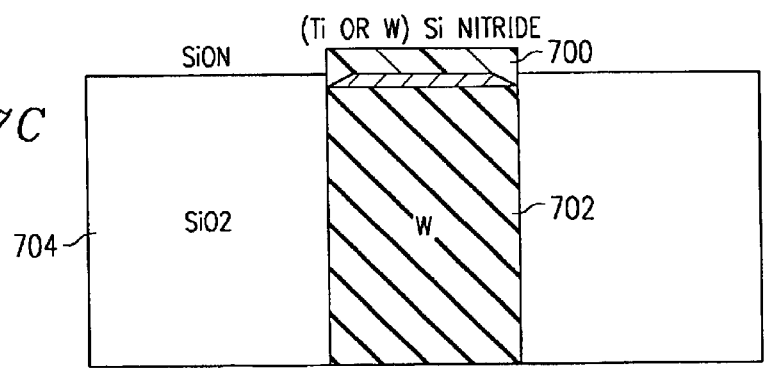

In FIG. 7, steps A–C illustrate how selective CVD of silicide, combined with the nitridization process creates a thin diffusion barrier 700 on plug 702 and SiO$_2$ 704 for successive layers of metallization.

Even more complicated diffusion barriers are relatively simple to make utilizing the present invention, with only a slight increase in processing complexity. A typical diffusion barrier, TiN, has one cation. An advanced diffusion barrier such as TaSiN, WSiN, TiSiN, or TiAlN has two cations. The present invention may be applied to create diffusion barriers with three cations.

Advantages of adding more elements include: 1) the fact that more elements typically make amorphous structures more stable to crystallization; and 2) specific properties, such as oxidation resistance or resistivity after oxidation, may be tailored to specific application requirements.

For example, starting with a standard titanium silicide covered plug, a new material may be deposited to make it more oxidation resistant (e.g., Cr or Al), or to improve the contact resistance after oxidation (e.g., Ru or Pt). That material is then partially silicided, and un-reacted material is removed in a wet etch (similar to salicide process) or dry etch (e.g., if reacted layer is inside a plug). The new complex Ti(Cr, Al, Ru, Pt) silicide is then subjected to this plasma nitridization process, during which the respective nitride will form.

Although the present invention has, up to this point, focused on applications requiring high-K materials, the present invention is equally applicable to forming diffusion barriers for VLSI metallization applications. For example, aluminum, and especially copper, need diffusion barriers. The structure illustrated in FIG. 5, Step B, is an ideal substrate for Al, AlCu, AlCuSi, or copper metallization. In the case of copper, the SiON surface is needed to prevent copper contamination of the underlying substrate. Other applications are illustrated in FIGS. 6 and 7. FIG. 6, Steps A–C, are a straightforward extension of the process illustrated in FIG. 5, except that the silicide is in a plug instead of at the surface. The silicide inside the plug illustrated in FIG. 6 could have been formed by any of the techniques of the present invention. Again, the nitridization anneal forms a diffusion barrier on the silicide that is not limited to silicon silicide. FIG. 7 illustrates an example of using the process of the present invention to form a diffusion barrier on a W plug 702 (other via materials may be utilized as required). This process is particularly advantageous where a selective silicide process has been developed but selective complex nitride diffusion does not exist. FIG. 7 thus illustrates an example of selectively depositing a silicide and then converting the nitride, according to the present invention.

Aside from utilizing titanium silicide, the present invention comprehends the use of a number of other suicides (e.g., tantalum silicide) that may be used in accordance with the processes disclosed herein. Tantalum silicide nitride, for example, is not only a good high-K barrier, but is also a good copper barrier.

One advantage of the present invention is that a barrier may be formed only where it is desired, thus allowing for selective oxidation. The process illustrated in FIG. 6, Steps A–C, is very advantageous for this application. For example, FIG. 6, Step B may be used, in DRAM processing, to deposit a thin layer of metal, then deposit high-K material, and finally to pattern top electrodes. The present invention thus overcomes the limitations of conventional methods in forming diffusion barriers at the bottom of a structure.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. The teachings and concepts of the present invention may be applied to a variety of sensor devices and applications. The principles of the present invention are practicable in a number of technologies. It is therefore intended that the appended claims encompass any such modifications or embodiments.

What is claimed is:

1. A method of forming a diffusion barrier within a semiconductor device, comprising the steps of:
   (a) providing a first device structure which comprises a metal;
   (b) nitriding a selected portion of the first device structure; and
   (c) disposing a second device structure upon the nitrided portion of the first device structure.

2. The method of claim 1 wherein the step of nitriding a selected portion of the first device structure further comprises subjecting the first device structure to an N$_2$ plasma treatment.

3. The method of claim 2 wherein the N$_2$ plasma treatment comprises subjecting the first device structure to 300 W RF power, 230 V$_{DC}$, and 80 m Torr at a 50° C. substrate temperature for 60 seconds.

4. The method of claim 1 wherein the metal comprises tungsten.

5. The method of claim 1 wherein the second device structure comprises a metal.

6. The method of claim 5 wherein the metal comprises aluminum.

* * * * *